(12) United States Patent
Chen

(10) Patent No.: US 12,538,723 B2
(45) Date of Patent: Jan. 27, 2026

(54) SILICON CARBIDE MOSFET DEVICE AND MANUFACTURING METHOD THEREOF

(71) Applicant: Hangzhou Silicon-Magic Semiconductor Technology Co., Ltd., Hangzhou (CN)

(72) Inventor: Hui Chen, Hangzhou (CN)

(73) Assignee: Hangzhou Silicon-Magic Semiconductor Technology Co., Ltd., Hangzhou (CN)

( * ) Notice: Subject to any disclaimer, the term of this patent is extended or adjusted under 35 U.S.C. 154(b) by 693 days.

(21) Appl. No.: 17/881,736

(22) Filed: Aug. 5, 2022

(65) Prior Publication Data
US 2023/0038280 A1    Feb. 9, 2023

(30) Foreign Application Priority Data
Aug. 5, 2021  (CN) .......................... 202110897831.3

(51) Int. Cl.
| | |
|---|---|
| *H01L 21/265* | (2006.01) |
| *H01L 21/04* | (2006.01) |
| *H10D 12/01* | (2025.01) |
| *H10D 30/66* | (2025.01) |
| *H10D 62/832* | (2025.01) |

(52) U.S. Cl.
CPC ......... *H01L 21/047* (2013.01); *H10D 12/031* (2025.01); *H10D 30/66* (2025.01); *H10D 62/8325* (2025.01)

(58) Field of Classification Search
CPC ... H10D 62/393; H10D 30/0291–0297; H10D 30/66–669; H01L 21/047; H01L 21/26586
See application file for complete search history.

(56) References Cited

U.S. PATENT DOCUMENTS

| | | | | |
|---|---|---|---|---|
| 2012/0261715 | A1* | 10/2012 | Kim | H10D 30/662 |
| | | | | 257/E29.183 |
| 2013/0299849 | A1* | 11/2013 | Tega | H10D 30/668 |
| | | | | 257/77 |
| 2016/0133707 | A1* | 5/2016 | Kubota | H10D 62/8325 |
| | | | | 257/77 |
| 2016/0141412 | A1* | 5/2016 | Yen | H10D 62/8325 |
| | | | | 257/77 |
| 2019/0013383 | A1* | 1/2019 | Tang | H10D 64/251 |
| 2022/0052176 | A1 | 2/2022 | Chen et al. | |
| 2023/0060069 | A1* | 2/2023 | Lee | H01L 21/0465 |

\* cited by examiner

*Primary Examiner* — Eric A. Ward
(74) *Attorney, Agent, or Firm* — Westman, Champlin & Koehler, P.A.

(57) ABSTRACT

Disclosed is a silicon carbide MOSFET device and a manufacturing method thereof. The manufacturing method comprises: forming a source region in an epitaxial layer; forming a body region in the epitaxial layer; forming a gate structure, comprising a gate dielectric layer, a gate conductor layer and an interlayer dielectric layer; forming an opening in the interlayer dielectric layer to expose the source region; forming a source contact connected to the source region via the opening, wherein an ion implantation angle of the ion implantation process is controlled to make a transverse extension range of the body region larger than a transverse extension range of the source region, so that a channel that extends transversely is formed by a portion, which is peripheral to the source region, of the body region, and at least a portion of the gate conductor layer is located above the channel.

10 Claims, 7 Drawing Sheets

SILICON CARBIDE MOSFET DEVICE AND MANUFACTURING METHOD THEREOF

CROSS-REFERENCE TO RELATED APPLICATIONS

The present application claims the priority to Chinese Patent Application No. 202110897831.3, filed on Aug. 5, 2021, entitled by "SILICON CARBIDE MOSFET DEVICE AND MANUFACTURING METHOD THEREOF", and published as CN113628973A on Nov. 9, 2021, which is incorporated herein by reference in its entirety.

FIELD OF TECHNOLOGY

The present disclosure relates to a technical field of self-aligned silicon carbide MOSFET devices, in particular to a silicon carbide MOSFET device and a manufacturing method thereof.

BACKGROUND

Silicon carbide (SiC) material has excellent physical and electrical properties. With its unique advantages, such as wide forbidden bandwidth, high thermal conductivity, high saturated drift velocity and strong critical breakdown electric field, Silicon carbide material becomes an ideal semiconductor material for making devices with high power, high frequency, high voltage, high temperature resistant and high radiation resistance, thereby having broad application prospects in military and civil fields. Silicon carbide metal-oxide-semiconductor field-effect transistor (MOSFET) devices have advantages of fast switching, low on-resistance and the like, and may achieve a higher breakdown voltage level with a thinner drift layer, and reduce the size of a power switch module and energy consumption, thereby having obvious advantages in application fields of power switches, converters, and the like.

Due to a low diffusion coefficient of ions in SiC, double diffusion which is used in a silicon (Si) MOSFET to form a channel by self-alignment may not be implemented in a SiC MOSFET. A general method for forming a channel of a SiC MOSFET device is to perform ion implantation by using two independent masks to form a P-type body region and a N+ source region. Meanwhile, since a resistance of the channel accounts for a non-negligible proportion in the SiC MOSFET device, in order to reduce an on-resistance, the channel is the shorter, the better. However, limited by photoetching accuracy, in a non-self-alignment process, an alignment deviation between different photoetching processes affects the performance and reliability of the device.

In order to achieve the shorter channel, the SiC MOSFET device can be manufactured based on a self-alignment process different from the self-alignment process for Si MOSFET. A conventional method is to first use a photo-etched polysilicon as a barrier layer for the P-type body region, and after the P-type body region is formed, oxidize the polysilicon to form silicon dioxide having a certain thickness on a surface and a sidewall of the polysilicon, and then, by using the silicon dioxide on the sidewall of the polysilicon as a barrier layer, perform self-aligned implantation for forming the N+ source region. However, this conventional method still may not precisely control the length of the channel and cannot further reduce the on-resistance.

SUMMARY

In view of the above problems, an objective of the present disclosure is to provide a silicon carbide MOSFET device and a manufacturing method thereof, which may precisely control a transverse extension length of a channel by adjusting implantation angle and energy of ion implantation for forming a body region, thereby realizing a short channel, and reducing an on-resistance.

According to one aspect of the present disclosure, provided is a manufacturing method of a silicon carbide MOSFET device. The manufacturing method comprises: forming an epitaxial layer of a first doping type on a first surface of a silicon carbide substrate of the first doping type; performing an ion implantation process on the epitaxial layer to form a source region of the first doping type; performing an ion implantation process on the epitaxial layer to form a body region of a second doping type, wherein the second doping type and the first doping type are opposite; forming a gate structure on a first surface of the epitaxial layer, wherein the gate structure comprises a gate dielectric layer, a gate conductor layer and an interlayer dielectric layer; forming an opening in the interlayer dielectric layer to expose a surface of the source region; and forming a source contact and a drain contact, wherein the source contact is formed on a surface of the interlayer dielectric layer and is connected to the source region via the opening, the drain contact is formed on a second surface of the substrate, wherein the ion implantation process for forming the source region and the ion implantation process for forming the body region are performed by use of a same mask, and ion implantation angles of the ion implantation process for forming the source region and the ion implantation process for forming the body region are controlled to make a transverse extension range of the body region larger than a transverse extension range of the source region, so that a channel that extends transversely is formed by a portion, which is peripheral to the source region, of the body region, and at least a portion of the gate conductor layer is located above the channel.

In some embodiments, an ion implantation direction of the ion implantation process for forming the source region is perpendicular to the first surface of the epitaxial layer, and the ion implantation angle of the ion implantation for forming the body region is tilted relative to the first surface of the epitaxial layer.

In some embodiments, the ion implantation angles and ion implantation energy are calculated according to a thickness of the mask and a length of the channel.

In some embodiments, between step of performing the ion implantation process on the epitaxial layer to form a body region of the second doping type and step of forming the gate structure on the first surface of the epitaxial layer, the manufacturing method further comprises: performing an ion implantation process on the epitaxial layer to form a first contact region of the second doping type and a second contact region of the second doping type, wherein the second contact region is located on the first contact region, the first contact region is extended to reach the body region, wherein a surface of the second contact region is exposed by the opening, and the source contact is connected to the second contact region.

In some embodiments, step of performing the ion implantation process on the epitaxial layer to form the source region of the first doping type comprises: forming a first barrier layer on the first surface of the epitaxial layer and forming a first via hole in the first barrier layer; and performing the ion implantation process on the epitaxial layer by using the first barrier layer as the mask to form the source region of the first doping type.

In some embodiments, step of performing the ion implantation process on the epitaxial layer to form the body region of the second doping type comprises: performing the ion implantation process, with a tilted implantation direction, on the epitaxial layer by using the first barrier layer as the mask to form the body region of the second doping type; and removing the first barrier layer.

In some embodiments, step of performing the ion implantation process on the epitaxial layer to form the first contact region of the second doping type and the second contact region of the second doping type comprises: forming a second barrier layer on the first surface of the epitaxial layer and forming a second via hole in the second barrier layer; performing multiple ion implantation processes, with the second barrier layer as a mask, on the epitaxial layer to form the first contact region and the second contact region; and removing the second barrier layer, wherein the first contact region is located below the second contact region, and a doping concentration of the second contact region is higher than a doping concentration of the first contact region.

In some embodiments, step of forming the gate structure on the first surface of the epitaxial layer comprises: forming the gate dielectric layer and the gate conductor layer on the first surface of the epitaxial layer; and removing the gate conductor layer above the second contact region and the gate conductor layer above a portion of the source region, and forming the interlayer dielectric layer on the gate dielectric layer and the gate conductor layer.

In some embodiments, the first doping type is N doping type, and the second doping type is P doping type.

According to a second aspect of the present disclosure, provided is a silicon carbide MOSFET device, comprises: a silicon carbide substrate of a first doping type; an epitaxial layer of the first doping type, wherein the epitaxial layer is located on a first surface of the substrate; a body region of a second doping type, wherein the body region is located in the epitaxial layer, and the second doping type and the first doping type are opposite; a source region of the first doping type, wherein the source region is located in the body region; a gate structure located on a first surface of the epitaxial layer, wherein the gate structure comprises a gate dielectric layer, a gate conductor layer, and an interlayer dielectric layer; an opening formed in the interlayer dielectric layer, wherein a surface of the source region is exposed by the opening; and a source contact and a drain contact, wherein the source contact is located on the surface of the interlayer dielectric layer and is connected to the source region via the opening, the drain contact is located on a second surface of the substrate, wherein a channel that extends transversely is formed by a portion, which is peripheral to the source region, of the body region, and at least a portion of the gate conductor layer is located above the channel.

In some embodiments, an ion implantation angle is controlled to make a transverse extension range of the body region larger than a transverse extension range of the source region, so that the channel is formed.

In some embodiments, a length of the channel that extends transversely is less than 0.5 µm.

In some embodiments, the silicon carbide MOSFET device further comprises: a first contact region and a second contact region, which are of the second doping type and located in the epitaxial layer, wherein the second contact region is located above the first contact region, and the first contact region is extended to reach the body region, wherein a surface of the second contact region is also exposed by the opening, and the source contact is connected to the second contact region.

In some embodiments, the first doping type is N doping type, and the second doping type is P doping type.

According to the silicon carbide MOSFET device and the manufacturing method thereof provided by the present disclosure, under a condition that the first barrier layer is provided with a via hole, a transverse extension length of the channel can be controlled by adjusting the implantation angle and energy of the ion implantation process for forming the body region, wherein a length of a portion, which exceeds a transverse extension range of the source region, of the transverse extension range of the body region is the length of the channel.

In the manufacturing method of the silicon carbide MOSFET device provided by the present disclosure, the source region and the body region are formed by use of the same mask, wherein the body region is formed by an ion implantation process performed with a tilted implantation angle. By use of the first barrier layer, the source region and the body region may be formed before the gate structure is formed. Therefore, compared with a method to control the length of the channel by forming a side wall of the gate structure, the manufacturing method provided by the present disclosure has the advantages that the length of the channel is easier to be controlled, and the channel may be made shorter.

BRIEF DESCRIPTION OF THE DRAWINGS

The above and other objectives, features and advantages of the present disclosure will become more apparent from the description of the embodiments of the present disclosure below with reference to the accompanying drawings, in which.

DETAILED DESCRIPTION OF THE EMBODIMENTS

Figure 1:
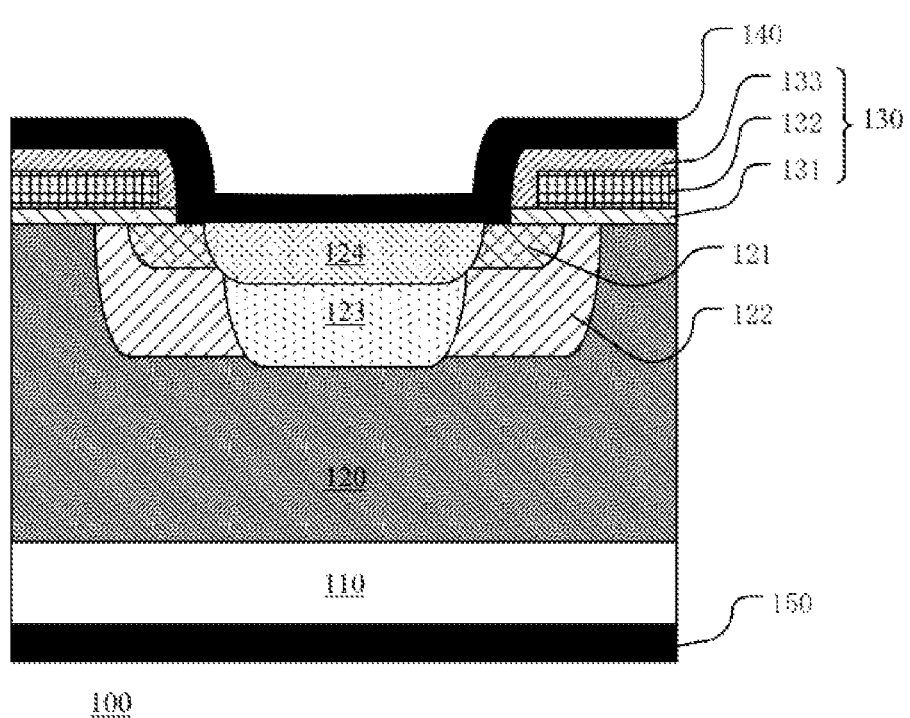
FIG. 1 shows a structural diagram of a silicon carbide MOSFET device according to an embodiment of the present disclosure.

The present disclosure will be described in more detail below with reference to the accompanying drawings. In each accompanying drawing, the same elements are denoted by the similar reference numerals. For the sake of clarity, each part in the accompanying drawings is not drawn to scale. In addition, some well-known parts may not be shown. For the sake of simplicity, a semiconductor structure obtained after several steps may be described in a drawing.

It should be understood that, during the description of the structure of a device, when a layer or region is referred to as being located "on" or "above" another layer or region, it may be directly located on another layer or region, or other layers or regions are also included between it and another layer or region. Moreover, if the device is turned over, the layer or region will be located "under" or "below" another layer or region.

In order to describe the situation of being directly located on another layer or region, the expression "directly on . . . " or "on and adjacent to . . . " will be adopted herein.

The specific implementation of the present disclosure will be further described in detail below with reference to the accompanying drawings and the embodiments.

FIG. 1 shows a structural diagram of a silicon carbide MOSFET device according to an embodiment of the present disclosure.

Referring to FIG. 1, the silicon carbide MOSFET device 100 according to the embodiment of the present disclosure comprises: a silicon carbide substrate 110 of a first doping type, an epitaxial layer 120 of the first doping type located on the substrate 110, a gate structure 130 and a source contact 140 located on the epitaxial layer 120, and a drain contact 150 located below the substrate 110. The device further comprises a body region 122 of a second doping type located in the epitaxial layer 120, a source region 121 of the first doping type, a first contact region 123 of the second doping type and a second contact region 124 of the second doping type. Specifically, the second contact region 124 is located on the first contact region 123, the body region 122 of the second doping type is located at both sides of the first contact region 123 and the second contact region 124, and the source region 121 of the first doping type is located in the body region 122 of the second doping type at both sides of the second contact region 124 and is in contact with the second contact region 124.

In this embodiment, the gate structure 130 is located on at least a portion of the source region 121 which is in the epitaxial layer 120, and a surface of the second contact region 124 and a surface of a portion of the source region 121 are exposed by the gate structure 130. The gate structure 130 comprises a gate dielectric layer 131, a gate conductor layer 132 and an interlayer dielectric layer 133. The gate dielectric layer 131 is located on a surface of the epitaxial layer 120, the gate conductor layer 132 is located on the gate dielectric layer 131, the interlayer dielectric layer 133 covers an upper surface and a sidewall of the gate conductor layer 132, and is connected to the gate dielectric layer 131, and the gate dielectric layer 131 and the interlayer dielectric layer 133 are made of a same material.

The source contact 140 is located on the second contact region 124 and a portion of the source region 121, and covers the gate structure 130. The drain contact 150 is located on a second surface, that is, a side surface, away from the epitaxial layer 120, of the substrate 110. In the final silicon carbide MOSFET device 100, a portion, which is located on the gate structure 130, of the source contact 140, needs to be etched to form a via hole for leading out a gate contact (not shown in the figure), so that the gate contact can be formed through the via hole.

In this embodiment, the first doping type is, for example, N doping type, and the second doping type is, for example, P doping type, or, the first doping type is P doping type, and the second doping type is N doping type. In the present disclosure, the source region 121 of the first doping type is a N+ type source region, the body region 122 of the second doping type is a P type body region, the first contact region 123 is a P type contact region, and the second contact region is a P+ type contact region. In addition, the substrate 110 in the present disclosure is an N+ type substrate, and the epitaxial layer 120 is an N− type epitaxial layer.

In the silicon carbide MOSFET device 100 shown in the present disclosure, a portion, that extends longer than the source region 121 in a transverse direction, of the body region 122 is the channel of the device. In the present disclosure, after a first barrier layer (not shown in FIG. 1) is formed, by performing an ion implantation process with a tilted implantation direction, the length of the channel may be precisely controlled by adjusting an implantation angle of inclination and implantation energy of the ion implantation process for forming the body region 122, thereby the channel can be realized with a short length and the on-resistance can be reduced.

Figure 2A:
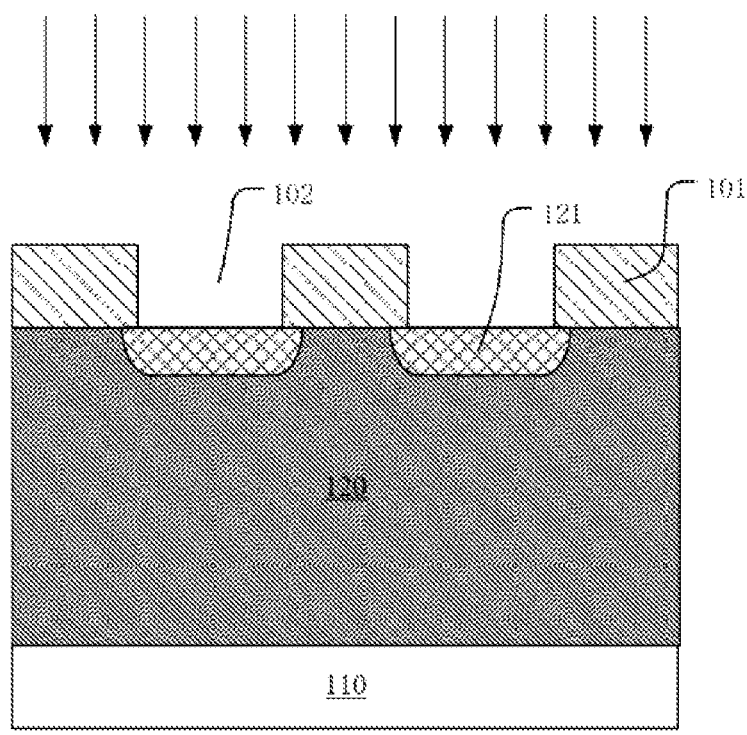
FIGS. 2a to 2f show cross-sectional views at stages of a manufacturing method of a silicon carbide MOSFET device according to an embodiment of the present disclosure.

FIGS. 2a-2f show cross-sectional views at stages of a manufacturing method of the silicon carbide MOSFET device according to an embodiment of the present disclosure. The manufacturing method specifically comprises following steps:

Step 1: a first barrier layer 101 is formed on an epitaxial layer 120, the first barrier layer is etched to form a plurality of first via holes 102, and an ion implantation process is performed on the epitaxial layer 120 through the plurality of first via holes 102 to form a plurality of source regions 121, respectively, as shown in FIG. 2a. It should be noted that, in an alternative embodiment according to the present disclosure, a single source region may be formed through a single first via hole by performing the ion implantation process.

In this step, the first barrier layer 101 is formed on a first surface of the epitaxial layer 120 by performing a chemical vapor deposition process, a physical vapor deposition process or a plasma-assisted deposition process, and then the first barrier layer 101 is etched by performing anisotropic etching, such as dry etching, plasma etching, reactive ion etching, laser ablating or the like, to form the plurality of first via holes 102, each of which penetrates through the first barrier layer 101 and exposes a portion of the first surface of the epitaxial layer 120, wherein the plurality of first via holes 102 serve as ion implantation windows in a subsequent step. In this embodiment, material of the first barrier layer 101 comprises polycrystalline silicon, silicon dioxide, silicon nitride or other material that may be used to form the barrier layer.

Further, the ion implantation process is performed on the epitaxial layer 120 through the plurality of first via holes 102, and in this step, the plurality of source regions 121 are formed by performing the ion implantation process in a direction perpendicular to the surface of the epitaxial layer 120. The width of each of the plurality of source regions 121 in the epitaxial layer 120 is controlled by a diameter of a corresponding one of the plurality of first via holes 102, and a depth of each of the plurality of source regions 121 in the epitaxial layer 120 is controlled by controlling ion implantation energy.

In this embodiment, the epitaxial layer 120 is located on a first surface of the substrate 110; and the epitaxial layer 120, each source region 121 and the substrate 110 are all of N doping type, wherein the substrate 110 and each source region 121 are of N+ doping type, and the epitaxial layer 120 is of N− doping type, that is, the substrate 110 and the plurality of source regions 121 each have a doping dose higher than a doping dose of the epitaxial layer 120.

Figure 2B:
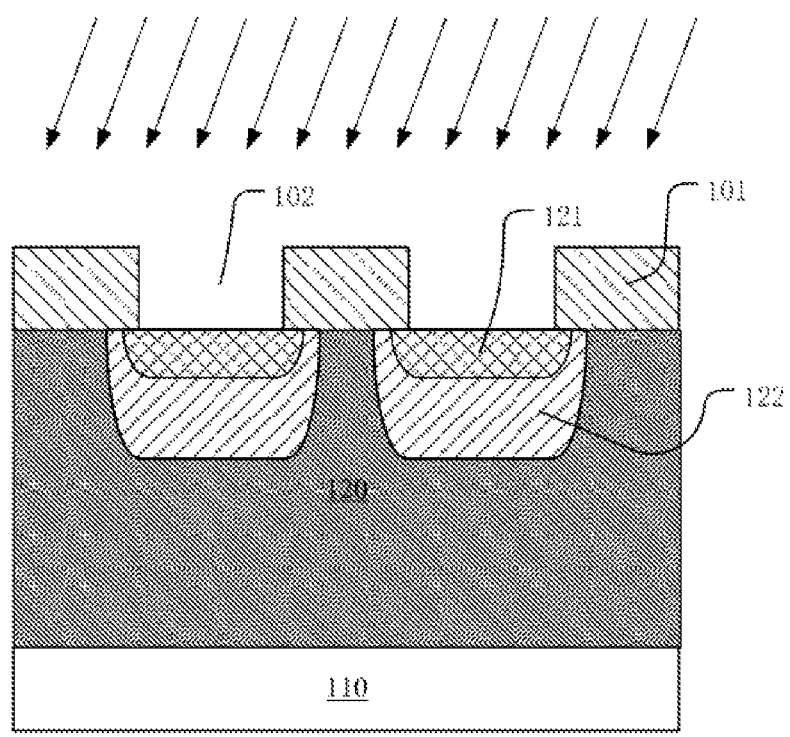

Step 2: a plurality of body regions 122 are formed in the epitaxial layer 120 through the first barrier layer 101, as shown in FIG. 2b. It should be noted that, in an alternative embodiment according to the present disclosure, if only a single source region is formed in the epitaxial layer 120, then only a single body region 122 may be formed in the epitaxial layer 120.

In this step, by using the first barrier layer 101 as a mask, an ion implantation process is performed on the epitaxial layer 120 through the plurality of first via holes 102 in the first barrier layer 101, to form the plurality of body regions 122.

In this embodiment, the plurality of body regions 122 are formed in the epitaxial layer 120 respectively through the first via holes 102 in the first barrier layer 101 by performing the ion implantation process with a tilted implantation direction, and each body region 122 is of a P doping type. Each of the plurality of body regions 122 is formed by implanting P-type ions, and a length of each of the plurality of body regions 122 in a direction along the first surface of the epitaxial layer 120 is greater than a length of each of the plurality of source regions 121 in the direction along the first surface of the epitaxial layer 120, that is, the plurality of source regions 121 are located in the plurality of body regions 122, respectively.

A distance between an edge of each source region 121 in the direction along the first surface of the epitaxial layer 120 and an edge of a corresponding one of the plurality of body regions 122 in the direction along the first surface of the epitaxial layer 120 is a length of the channel of the semiconductor device. In this embodiment, a transverse length of the channel is less than 0.5 µm. In the present disclosure, the length of the channel may be precisely controlled by adjusting an implantation angle and implantation energy of the ion implantation process performed for forming the plurality of body regions 122, or, a tilted implantation angle and energy of the ion implantation process may be calculated according to a thickness of the first barrier layer 101 and the length of the channel, thereby realizing shorter channel and reducing on-resistance.

In this embodiment, during the ion implantation process for forming the plurality of body regions 122, the substrate 110 is rotated, so that portions, exceeding the first barrier layer 101, of the plurality of body regions 122 have a same length in each region of the epitaxial layer 120. Therefore, uniformity of the length of the channel of the device can be improved, and device reliability can be enhanced.

Figure 2C:
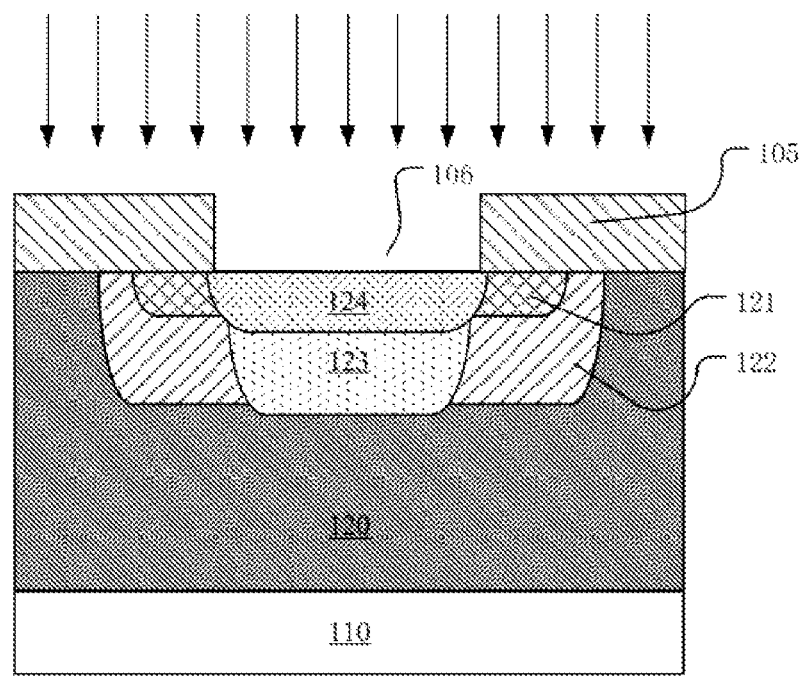

Step 3: the first barrier layer 101 is removed, a patterned second barrier layer 105 is formed on the first surface of the epitaxial layer 120, and a first contact region 123 and a second contact region 124 are formed in the epitaxial layer 120, as shown in FIG. 2c.

In this step, a wet etching process is performed, wherein the semiconductor structure is immersed into an etching solution to remove the first barrier layer 101, the second barrier layer 105 is deposited on the first surface of the epitaxial layer 120, the second barrier layer 105 is patterned, and a second via hole 106 is formed through the second barrier layer 105. In this embodiment, the second via hole 106 exposes the first surface of the epitaxial layer 120 and exposes a portion of each source region 121, each body region 122 and a portion, which is located between adjacent ones of the plurality of body regions 122, of the epitaxial layer 120. Material of the second barrier layer 105 comprises polycrystalline silicon, silicon dioxide, silicon nitride or other material that may be used to form the barrier layer.

Further, the ion implantation process is performed on the epitaxial layer through the second via hole 106 in the second barrier layer 105 to form the first contact region 123 and the second contact region 124, and the first contact region 123 and the second contact region 124 are of P doping type. Specifically, during the ion implantation process, the ion implantation process may be performed for multiple times, and by adjusting the incident energy of the ion implantation process, a doping dose of the second contact region 124 which is close to the first surface of the epitaxial layer 120, is higher than a doping dose of the first contact region 123 located below the second contact region 124.

In this embodiment, a depth of a junction between the first contact region 123 and the second contact region 124 is equal to or greater than the depth of each body region 122.

Figure 2D:
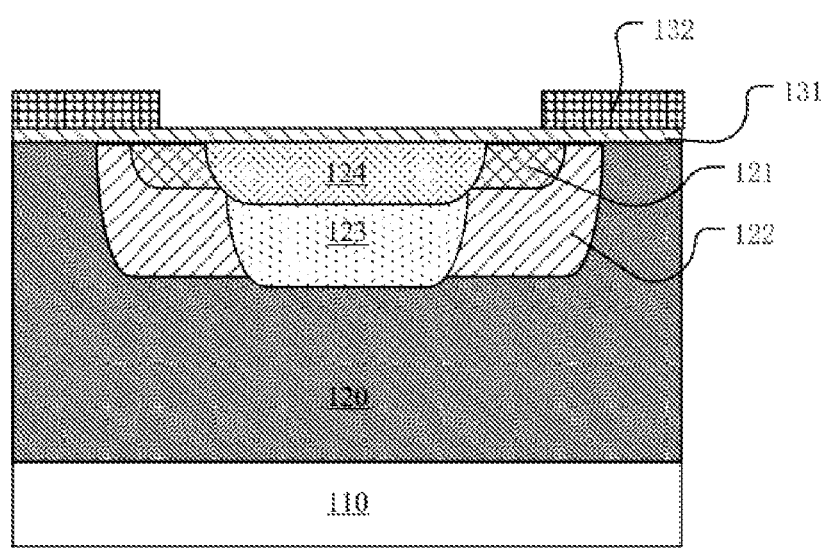

Step 4: the second barrier layer 105 is removed, and a gate dielectric layer 131 and a gate conductor layer 132 are formed on the first surface of the epitaxial layer 120, as shown in FIG. 2d.

In this step, a wet etching process is performed, wherein the semiconductor structure is immersed into an etching solution to remove the second barrier layer 105, and the gate dielectric layer 131 and the gate conductor layer 132 are deposited on the first surface of the epitaxial layer 120 by performing chemical vapor deposition process, which can be a physical vapor deposition process or a plasma-assisted deposition process.

Further, the manufacturing method further comprises a step of patterning the gate conductor layer 132 to expose a portion, which is located above the second contact layer 124, of the gate dielectric layer 131 and a portion, which is located above part of each source region 121, of the gate dielectric layer 131.

In this embodiment, between the step of removing the second barrier layer 105 and the step of forming the gate dielectric layer 131, the manufacturing method further comprises: performing activation annealing process on the regions formed by performing ion implantation in the epitaxial layer 120.

Figure 2E:
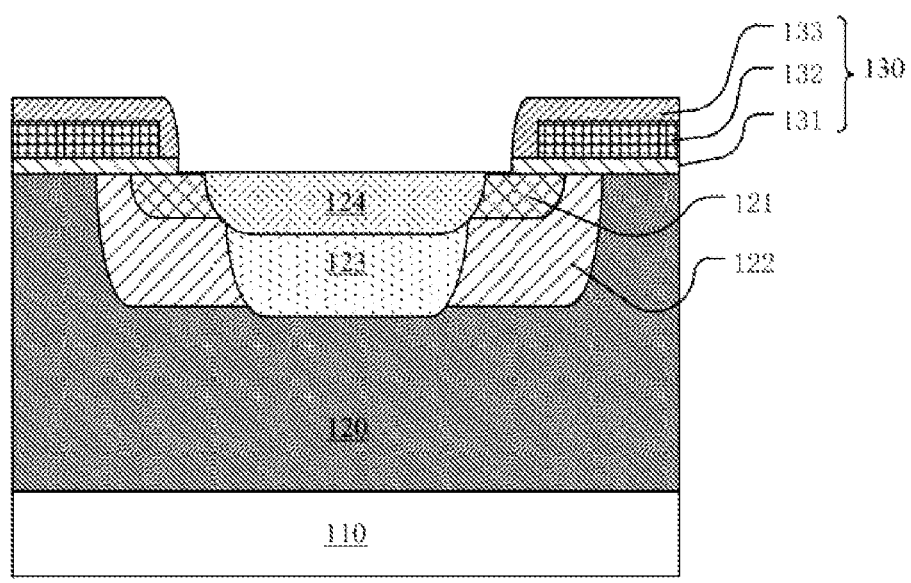

Step 5: an interlayer dielectric layer 133 is formed on surfaces of the gate dielectric layer 131 and the gate conductor layer 132, and the interlayer dielectric layer 133 and the gate dielectric layer 131 are etched to expose a portion of a surface of the epitaxial layer 120, as shown in FIG. 2e.

In this step, the interlayer dielectric layer 133 is deposited on the surfaces of the gate dielectric layer 131 and the gate conductor layer 132 by performing a chemical vapor deposition process, a physical vapor deposition process or a plasma-assisted deposition process. Since the gate conductor layer 132 is only located at two sides of the semiconductor structure and the gate dielectric layer 131 is exposed in an intermediate region between the two sides of the semiconductor structure, the interlayer dielectric layer 133 can be in contact with the gate dielectric layer in the intermediate region, thereby enabling the gate dielectric layer 131 and the interlayer dielectric layer 133 to surround the gate conductor layer 132.

Further, the manufacturing method also comprises: etching a portion, which is located in the intermediate region, of the interlayer dielectric layer 133 and a portion, which is located in the intermediate region, of the gate dielectric layer 131 to form an opening, so as to expose the surface of the second contact region 124 and a surface of a portion of each source region 121 in the epitaxial layer 120. In addition, the gate conductor layer 132 is still surrounded by the interlayer dielectric layer 133 and the gate dielectric layer 131 which are formed after this etching step.

Figure 2F:
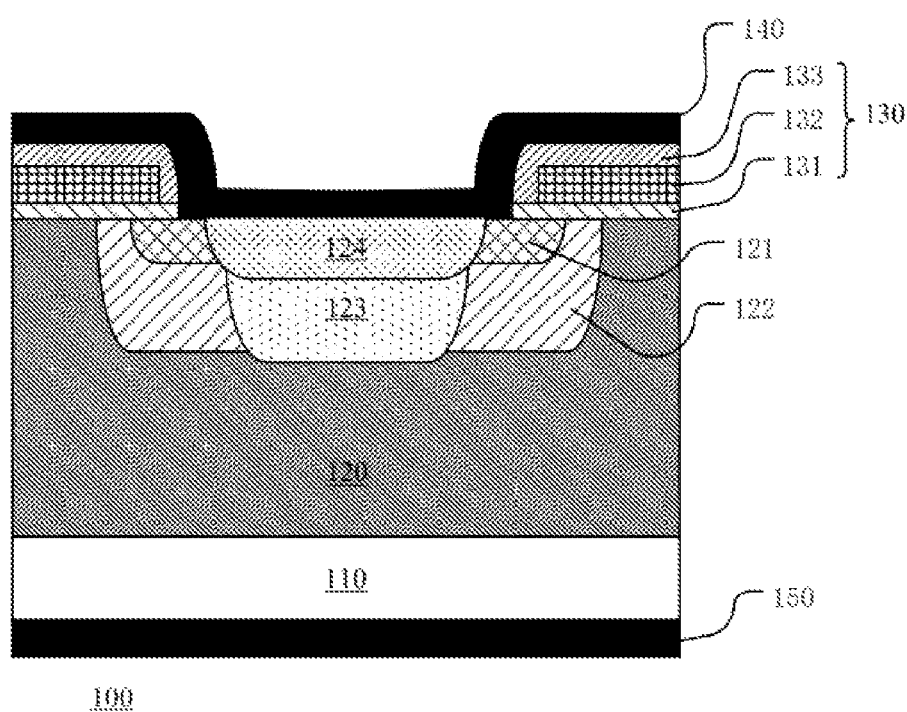

Step 6: a source contact 140 is deposited on a first surface of the semiconductor structure and a drain contact 150 is formed on a second surface of the substrate 110, as shown in FIG. 2f.

In this step, a chemical vapor deposition process, a physical vapor deposition process or a plasma-assisted deposition process can be performed to depositing the source contact 140 on the first surface of the semiconductor structure, and depositing the drain contact 150 on the second surface of the substrate 110, respectively. In this embodiment, the source contact 140 is in contact with the surface of the first contact region 124 and the surface of a portion of each source region 121 in the epitaxial layer 120 through the opening in the interlayer dielectric layer 133, and covers the surface of the gate structure 130. The drain contact 150 covers the second surface of the substrate 110, and the source contact 140 and the drain contact 150 can both be made of thickened alloy.

After step 6 shown as FIG. 2f, the manufacturing method further comprises: etching a portion, which is located above the gate structure 130, of the source contact 140 to form a contact hole, which is used for leading out a gate electrode connected to the gate structure.

It should be understood that, in some embodiments, one or more source regions 121 can be formed through the plurality of first via holes 102 in the first barrier layer 101, one or more body regions 121 can be formed through the plurality of first via holes 102 in the first barrier layer 101, each source region 121 is located in a corresponding body region 122, and correspondingly, one or more gate structures 130, each of which comprises the interlayer dielectric layer 133, the gate dielectric layer 131 and the gate conductor layer 132, can be formed on the epitaxial layer 120.

The silicon carbide MOSFET device and the manufacturing method thereof provided by the present disclosure, under a condition that the first barrier layer is provided with a via hole, a transverse extension length of the channel can be controlled by adjusting the implantation angle and energy of the ion implantation process for forming the body region, wherein a length of a portion, which exceeds a transverse extension range of the source region, of the transverse extension range of the body region is the length of the channel.

In the manufacturing method of the silicon carbide MOSFET device provided by the present disclosure, the source region and the body region are formed by use of the same mask, wherein the body region is formed by an ion implantation process performed with a tilted implantation angle. By use of the first barrier layer, the source region and the body region may be formed before the gate structure is formed. Therefore, compared with a method to control the length of the channel by forming a side wall of the gate structure, the manufacturing method provided by the present disclosure has the advantages that the length of the channel is easier to be controlled, and the channel may be made shorter.

The embodiments in accordance with the present disclosure, as described above, neither describe all details thoroughly nor limit the present disclosure, and are only the specific embodiments. Apparently, many modifications and variations are possible in light of the above description. These embodiments are selected and specifically described in this description to better explain the principle and practical application of the present disclosure, so that those skilled in the art may make good use of the present disclosure and modifications based on the present disclosure. The present disclosure is to be limited only by the claims and their full scope and equivalents.

The invention claimed is:

1. A manufacturing method of a silicon carbide MOSFET device, wherein the manufacturing method comprises:
    forming an epitaxial layer of a first doping type on a first surface of a silicon carbide substrate of the first doping type;
    performing an ion implantation process on the epitaxial layer to form a source region of the first doping type;
    performing an ion implantation process on the epitaxial layer to form a body region of a second doping type, wherein the second doping type and the first doping type are opposite;
    forming a gate structure on a first surface of the epitaxial layer, wherein the gate structure comprises a gate dielectric layer, a gate conductor layer, and an interlayer dielectric layer;
    forming an opening in the interlayer dielectric layer to expose a surface of the source region; and
    forming a source contact and a drain contact, wherein the source contact is formed on a surface of the interlayer dielectric layer and is connected to the source region via the opening, the drain contact is formed on a second surface of the substrate,
    wherein the ion implantation process for forming the source region and the ion implantation process for forming the body region are performed by use of a same mask, and ion implantation angles of the ion implantation process for forming the source region and the ion implantation process for forming the body region are controlled to make a transverse extension range of the body region larger than a transverse extension range of the source region, so that a channel that extends transversely is formed by a portion, which is peripheral to the source region, of the body region, and at least a portion of the gate conductor layer is located above the channel,
    wherein a first contact region of the second doping type and a second contact region of the second doping type are formed in the interlayer dielectric layer, the second contact region is located on the first contact region, the first contact region is extended to reach the body region, a surface of the second contact region is exposed by the opening, and a doping concentration of the second contact region is higher than a doping concentration of the first contact region,
    wherein a depth of an interface region between the first contact region and the second contact region is greater than a bottom depth of the source region and less than a bottom depth of the body region.

2. The manufacturing method according to claim 1, wherein an ion implantation direction of the ion implantation process for forming the source region is perpendicular to the first surface of the epitaxial layer, and the ion implantation angle of the ion implantation process for forming the body region is tilted relative to the first surface of the epitaxial layer.

3. The manufacturing method according to claim 2, wherein the ion implantation angles and ion implantation energy are calculated according to a thickness of the mask and a length of the channel.

4. The manufacturing method according to claim 1, wherein between step of performing the ion implantation process on the epitaxial layer to form a body region of the second doping type and step of forming the gate structure on the first surface of the epitaxial layer, the manufacturing method further comprises:
    performing an ion implantation process on the epitaxial layer to form the first contact region of the second doping type and the second contact region of the second doping type,
    wherein the source contact is connected to the second contact region.

5. The manufacturing method according to claim 4, wherein step of performing the ion implantation process on the epitaxial layer to form the first contact region of the second doping type and the second contact region of the second doping type comprises:
    forming a second barrier layer on the first surface of the epitaxial layer and forming a second via hole in the second barrier layer;
    performing multiple ion implantation processes, with the second barrier layer as a mask, on the epitaxial layer to form the first contact region and the second contact region; and removing the second barrier layer,
    wherein the first contact region is located below the second contact region.

6. The manufacturing method according to claim 1, wherein step of performing the ion implantation process on the epitaxial layer to form the source region of the first doping type comprises:
- forming a first barrier layer on the first surface of the epitaxial layer and forming a first via hole in the first barrier layer; and
- performing the ion implantation process on the epitaxial layer by using the first barrier layer as the mask to form the source region of the first doping type.

7. The manufacturing method according to claim 6, wherein step of performing the ion implantation process on the epitaxial layer to form the body region of the second doping type comprises:
- performing the ion implantation process, with a tilted implantation direction, on the epitaxial layer by using the first barrier layer as the mask to form the body region of the second doping type; and
- removing the first barrier layer.

8. The manufacturing method according to claim 1, wherein step of forming the gate structure on the first surface of the epitaxial layer comprises:
- forming the gate dielectric layer and the gate conductor layer on the first surface of the epitaxial layer; and
- removing the gate conductor layer above the second contact region and the gate conductor layer above a portion of the source region, and forming the interlayer dielectric layer on the gate dielectric layer and the gate conductor layer.

9. The manufacturing method according to claim 1, wherein the first doping type is N doping type, and the second doping type is P doping type.

10. The manufacturing method according to claim 1, wherein during the ion implantation process for forming the body region, the silicon carbide substrate is rotated and an ion implantation direction remains unchanged.

\* \* \* \* \*